(12) United States Patent
Iliadis

(10) Patent No.: US 6,340,826 B1
(45) Date of Patent: Jan. 22, 2002

(54) INFRA-RED LIGHT EMITTING SI-MOSFET

(76) Inventor: Agisilaos Iliadis, 2705 Falling Brook Terr., Adelphi, MD (US) 20783

(*) Notice: Subject to any disclaimer, the term of this patent is extended or adjusted under 35 U.S.C. 154(b) by 0 days.

(21) Appl. No.: 09/534,569

(22) Filed: Mar. 27, 2000

Related U.S. Application Data

(63) Continuation-in-part of application No. 09/050,211, filed on Mar. 30, 1998, now abandoned.

(51) Int. Cl.$^7$ .................... H01L 31/062; H01L 27/15
(52) U.S. Cl. .................... 257/292; 257/79; 257/462; 257/465
(58) Field of Search .................... 257/79, 83, 292, 257/462, 465, 545

(56) References Cited

U.S. PATENT DOCUMENTS

| | | | | |
|---|---|---|---|---|
| 4,636,822 A | * | 1/1987 | Codella et al. | 257/282 |
| 5,233,187 A | * | 8/1993 | Sakata et al. | 250/227.24 |
| 5,304,827 A | * | 4/1994 | Malhi et al. | 257/262 |
| 5,607,876 A | * | 3/1997 | Biegelsen et al. | 438/45 |
| 5,667,905 A | * | 9/1997 | Campisano et al. | 428/690 |
| 5,698,874 A | * | 12/1997 | Hayashi | 257/233 |
| 5,712,497 A | * | 1/1998 | Watanabe et al. | 257/218 |
| 5,898,196 A | * | 4/1999 | Hook et al. | 257/292 |

OTHER PUBLICATIONS

Ennen et al., 1.54–um Electroluminescence of Erbium–Doped Silicon Grown by Molecular Beam Epitaxy, Feb. 1985, Appl. Phys. Lett. vol. 46 (4), pp. 381–383.*

* cited by examiner

*Primary Examiner*—Allan R. Wilson
(74) *Attorney, Agent, or Firm*—H. C. Lin Patent Agent

(57) ABSTRACT

A light emitting field effect transistor is proposed with a new extended drain region. The extension is doped with erbium or other rare-earth atoms. The erbium provides light-emitting centers in the indirect bandgap silicon substrate to enhance the radiative process. When a drain voltage is applied to create a high enough electric, energetic electrons entering this region interact with Er to emit infrared light.

9 Claims, 2 Drawing Sheets

INFRA-RED LIGHT EMITTING SI-MOSFET

This application is a Continuation-in-part U.S. patent application No. 09/050,211 filed Mar. 30, 1998, now abandoned.

BACKGROUND OF THE INVENTION

This invention relates to light emitting devices, in particular to an infra-red light emitting metal-oxide-semiconductor field effect transistor (MOSFET).

Light emitting devices are widely used in electronics for the emission of optical radiation as a result of electronic excitation. The radiation spectrum may be ultraviolet, visible or infrared. These devices are diodes and are traditionally fabricated with direct bandgap semiconductors. Silicon semiconductor, which is the main material for integrated circuits is not suitable for light emitting purpose, because it is an indirect bandgap material and cannot produce efficient light emission.

SUMMARY

An object of this invention is to fabricate a light emitting device in silicon. Another object of this invention is to fabricate a MOSFET which is light emitting. Still another object of this invention is to integrate an infrared light emitting device in an integrated structure.

These objects are achieved in this invention by incorporating an extension to the drain of a MOSFET. This extension is doped with erbium (Er) impurity, which forms a light-emitting center to enhance radiative process in an indirect semiconductor such as silicon. In operation, the electrons generated in the channel of the MOSFET travel toward the drain region where they experience high electric field existing in this region, excite and ionize the Er atoms, which then relax by emitting light in the infrared range of 1.54 μm.

DETAILED DESCRIPTION OF THE PREFERRED EMBODIMENT

The invention, designated here the "Light Emitting Metal-Oxide-Semiconductor Field Effect Transistor (LEMOSFET), has a new drain region designed for Infra-Red (IR) light-emission. The invention represents a breakthrough in Si-based technology, which lacks light emitting sources due to the indirect energy band structure of Si. With the present invention, a fully integrated (VLSI/ULSI) Si-based opto-electronic circuit technology is now realizable, with vast potential applications in telecommunications, satellite, mobile platforms, free-space intercommunication systems, programmable, coded/interactive identification friend/foe (IFF's) modules, surveillance, guidance systems, displays and other related applications.

Figure 1:
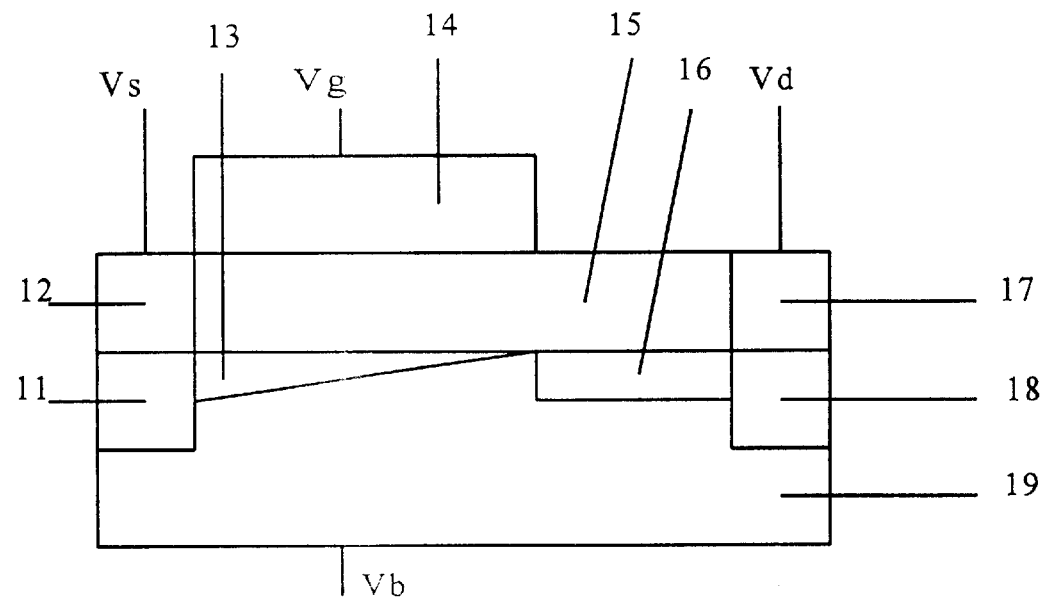
FIG. 1 shows the structure of a infrared light emitting MOSFET of the present invention.

The basic structure of the LEMOSFET is shown in FIG. 1. This device is basically an n-channel MOSFET with a p-type substrate 19, an n+type source 11, a gate 14, an n+type drain 18. The gate is insulated from the substrate by gate oxide 15. When a reference source voltage Vs (usually ground) is applied to the source 11 through a contact 12 and a gate voltage Vg in excess of the threshold voltage is applied to the gate 14, a conducting channel 13 is formed. When a high drain voltage Vd is applied to the drain 18 through contact 17, current flows in the channel 13, and the electric field along the channel is highest near the drain extension 16. The feature of this invention is a new extended drain region 16, which encroaches toward the source 11 and may have some overlap with drain 18. This extended drain region 16 is formed by incorporating rare earth element Erbium (Er), or other rare-earth elements by implantation or other means (drive-in diffusion, direct growth, etc.). Er is a rare-earth element, which, when incorporated in a host material matrix, such as Si, GaAs, InP and others, produces photoluminescence at a wavelength of 1.54 μm upon excitation by appropriate light. Hence, Er doped Silica fibers and other materials have been used for light propagation and amplification in optical-fiber communication systems. Such technology requires the use of light sources (lasers or light emitting diodes) to excite the photoluminescence from the Er doped material, which, at the 1.54 μm range, are usually III-V compound semiconductor based lasers (InGaAsP/InP) and not readily integrable or compatible with Si technology. Furthermore, they are more costly, requiring more complex circuitry to function, thus less power efficient. The invention being disclosed here, provides a readily integrable technology, less costly, and of significantly lower circuit complexity resulting in more power efficient modules.

Highly energetic or "hot" electrons are generated at the drain region of MOSFETs (such as the drain region 16 and 18 in FIG. 1) and FETs where the electric field is highest under standard biasing conditions, and can be suppressed or enhanced by appropriate design of the geometry, size, doping and configuration of the transistor. Significant distributions of these electrons are generated in submicron MOSFETs, and are known to degrade the operation of the device. They have been the subject of numerous studies seeking to suppress such phenomena. Er-doped and other rare-earth doped materials are known to produce light emissions at various wavelengths when excited by light (photoluminescence). Impact excitation is also a process that is known to produce luminescence using energetic particles, such as electrons from the gun of a Scanning Electron Microscope (cathodoluminescence).

The present invention uses these two phenomena in synergy to produce light emission i.e., the energetic electrons generated by the MOSFET as the source of particles to impact excite the new Er-doped drain region 16 in the MOSFET, and to produce luminescence at 1.54 μm by the de-excitation of the Er atoms in the Si host matrix. Since both phenomena are well documented, the interaction of energetic particles with the new region 16, in principle and in practical terms, is possible, and the concept of the invention is valid.

The principle of operation of the invention is based on the generation of light at the new Er-doped drain area 16 of the LEMOSFET, by impact excitation from energetic electrons that are generated in the channel of the device under electric field. Therefore no other source of light is required here. Under standard biasing conditions, the gate-drain region of the LEMOSFET is reverse biased and the high electric field of the region will generate a distribution of energetic electrons with enough energy (~0.8 eV or higher) to impact-excite the new Er-doped drain region placed in their path, and excite the Er atoms in the Si matrix. The de-excitation of the Er-doped region results in the emission of light at 1.54 μm ( in this case cathodoluminescence). The advantage in this case is twofold: (a) the light emission emanates from either the surface of the device or in plane, thus naturally lending itself to displays, chip-to-chip free space communications and on-chip interconnects, and (b) the device is electrically controllable with the switching speed and efficiency comparable to standard micron and submicron gate MOSFETs.

The three terminal light emitting device uses an external positive gate bias to provide a vertical electric field to form the channel under the gate, The application of an external positive bias on the drain produces the lateral electric field that accelerates the channel electrons towards the drain. The lateral electric field strength and distribution can be appropriately controlled by the external bias and the geometry of the drain and extended drain, The lateral field is made large so that a distribution of high energy electrons with energies between 0.82 eV and 0.95 eV is generated at the edge of the gate region and enters the extended drain region. The highly energetic electrons enter the extended drain =region under the influence of the controlled large lateral electric field, and direct impact-excite the light-emitting centers distributed within the Si matrix in the extended drain region. Since there is no vertical field in this region (no gate) the high energy electron distribution will be further enhanced in the high field region without deviating from its path to be received by the light emitting centers. Upon direct impact-excitation the Er atoms emit light at 1.54 μm and the electrons thermalize (loose their energy) to be collected by the drain. Since the direct impact-excitation process by energetic electrons excites the dominant (1.54 μm) core light-emitting transition in the Er atoms directly, it is a faster and more efficient light emitting process than that produced by recombinant processes that require intermediate Er centers to trigger the dominant transition. Therefore our invention controling the flow and number of electrons in the channel (by the gate), the energy distribution and path of the electrons by the lateral electric field (by the drain and extended drain) and the light emission at 1.54 μm by direct impact-excitation of Er atoms is substantially different from other two terminal light-emitting devices.

Preliminary calculations indicate that a distribution of energetic electrons with energy 0.8 eV or higher is attainable. In the present invention, these energetic electrons are used constructively to provide a source of particles to excite the special Er-doped region at the drain, and hence, the invented device is completely novel, since it is designed to enhance rather than suppress the production of energetic electrons and use these electrons to interact with the Er-doped region for light generation. Emission is controlled by the external bias on the MOSFETs and it is readily integrable with the existing Si technology.

The same approach can be applied to any Field Effect Transistor (FET) based on Si or any compound semiconductor such as GaAs, InP, etc., or any other commercially important material, in order to generate light emission from the new drain region of the device. The emission can be further enhanced by the incorporation of oxygen (O) or other impurities like fluorine (F) with the Er impurity in the new drain region 16 by co-implantation or other means. Furthermore, co-incorporation of Er and CaF (CaErF) in the new drain region 16 can provide visible emission.

Variations of the invention can be made with the following modifications:
 1. IR Light Emitting Si Bipolar Transistor (FIG. 2) and Heterojunction Bipolar Transistor.
 2. IR Light emitting Junction field effect transistor (JFET) (FIG. 3).
 3. IR Compound Semiconductor Light Emitting Metal Semiconductor field effect transistors (MESFETs and Heterojunction FETS) (GaAs, AlGaAs, InGaAs, InP, SiC, GaN, etc.) FIG. 4)

Figure 2:
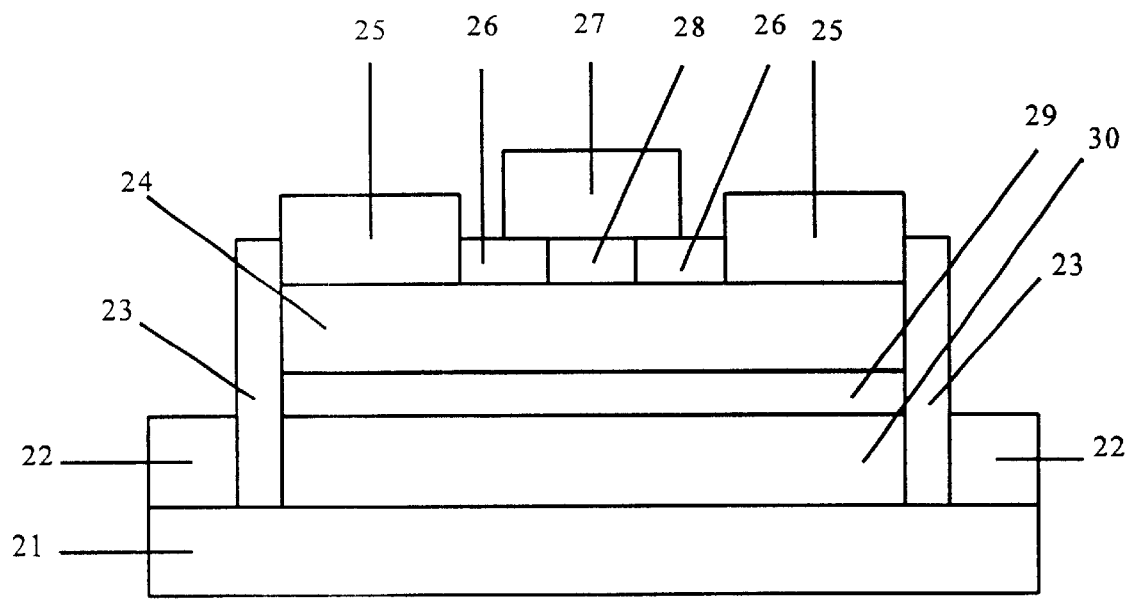
FIG. 2 shows the structure of a light emitting bipolar transistor of the present invention.

FIG. 2 shows the structure of a light emitting bipolar NPN transistor (BJT) of the present invention. The transistor has highly doped $N^+$ collector region 21, an ohmic contact 22 to the collector 21, a silicon dioxide layer 23, a p-type base region 24, an ohmic contact 25 to the base, a silicon dioxide ($SiO_2$) layer 26, an ohmic contact 27 to a highly doped n-type emitter 28, and a moderately doped n-type collector 20. The collector has an extended sub-collector Er doped region 29, which functions to emit infrared light just as in the case of the MOSFET described in FIG. 1. Again here electrons from the base enter the high field reverse biased base-collector junction become energetic and impact excite the Er impurity atoms which then relax by emitting light at 1.54 μm.

Figure 3:
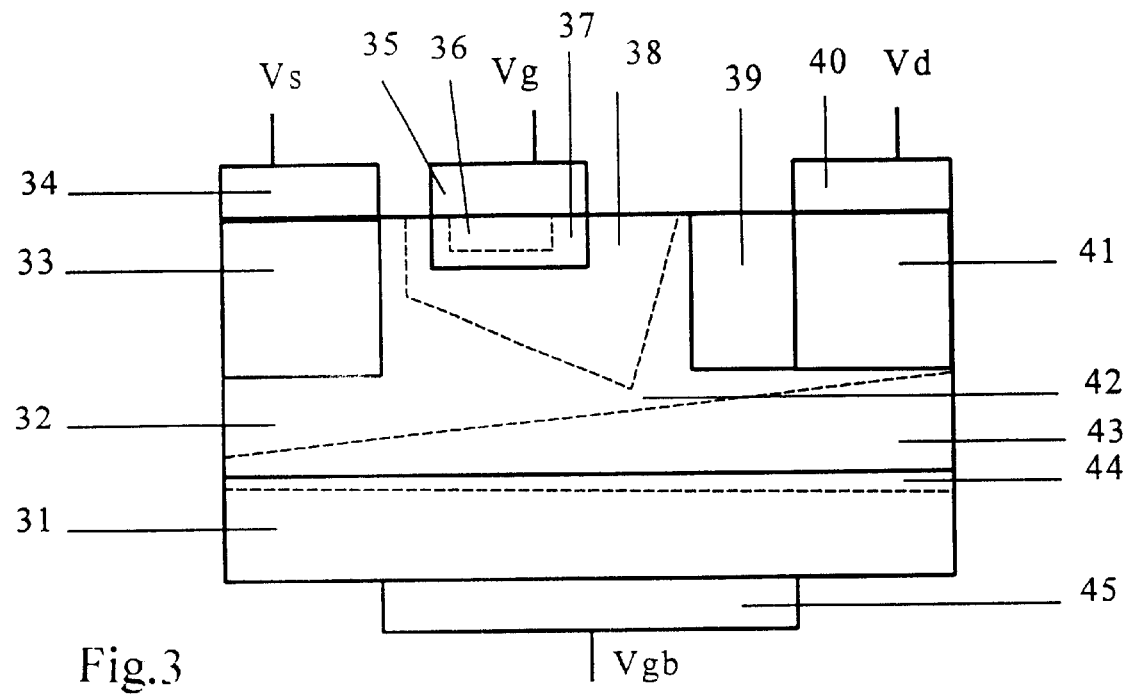
FIG. 3 shows the structure of a light emitting junction FET of the present invention.
Figure 4:
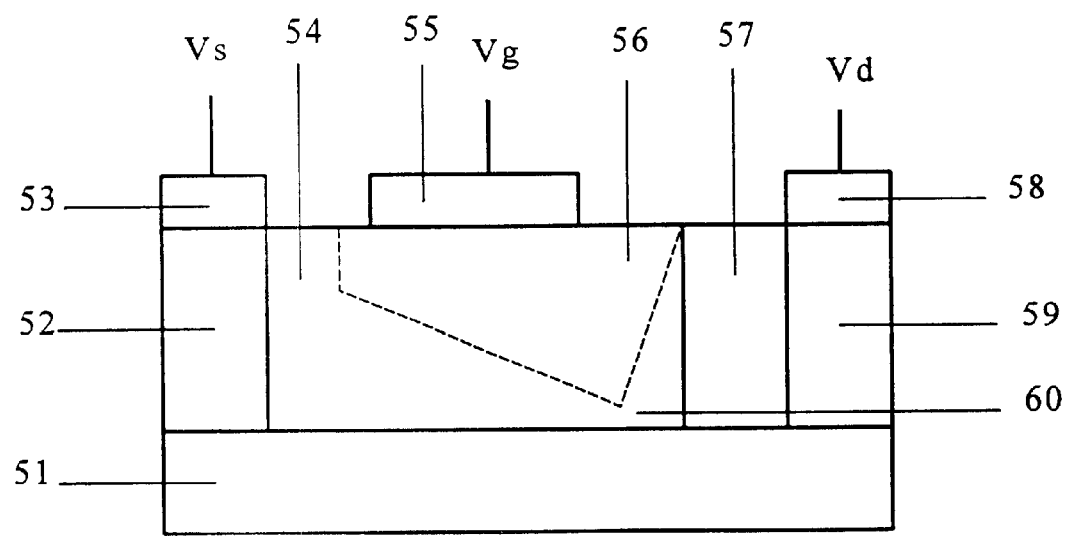
FIG. 4 shows the structure of a light emitting MESFET of the present invention.

FIG. 3 shows the structure of a light emitting junction-type field effect transistor (JFET) of the present invention. The structure of an n-channel JFET has a highly doped $P^+$ substrate 31, a moderately doped N-type active layer 32, a highly doped N-type source electrode region 33, a metal contact to the source electrode 34, a metal contact 35 to gate electrode 36, a depletion region 37, on the $P^+$ side of the PN junction of the gate electrode 36, a depletion region 38 on the moderately doped N-side of the PN junction of the gate electrode, an Er or Er-O region 39 for light emission, a metal contact 40 for the highly doped $N^+$type drain electrode region, an n-channel 32, a depletion region 33 on the moderately doped n-side of the PN junction of the active layer, a depletion region 34 on the highly doped $P^+$ side of the PN junction of the active/substrate layer, a metal contact 35 to the substrate 31.

FIG. 4 shows the structure of a light emitting metal-semiconductor field effect transistor (MESFET). The structure has a semi-insulating substrate 51, a highly-doped implanted or diffused source electrode 52, a metal ohmic contact 53 to the source electrode 52, a moderately doped N-type active layer, a metal semiconductor gate electrode 55, a depletion in the moderately doped N-side of the active layer, an Er or Er-O light emitting region 57, a metal ohmic contact 58 to the highly doped drain electrode 59, and an n-channel.

The advantages of the present invention are as follows:
 a. The novel feature in the invention is the new Er-doped extended drain region that gives the light emission capabilities to the MOSFETs, thus resulting in a new type of electrically controlled light emitting transistor the LEMOSFET. This new device is designed to enhance the production of energetic electrons (rather than suppress it) and their interaction with the new drain region for efficient light emission, and hence, obeys different design rules than the existing Si-MOSFET (and other FETs) devices in industry today.
 b. Currently there is no light emitting capability in Si technology. The present invention provides the light emission capability badly needed in Si technology today. As such it is a breakthrough in Si based optoelectronics and it is expected to have global impact on digital/analog IC Si technology.

The new technology should find many practical applications:
 1. Infra-Red (IR) light emitters for combat field applications such as: low cost, portable, programmable, coded identification friend/foe (IFF's) units.

2. Optical Communication modules. Free space, optical fiber, chip to chip interconnection.
3. IR Airplane Heads-Up-Displays(HUD's) for night operations.
4. Visible low cost, fast Flat Panel Displays.
5. Optical computing.
6. Infra-Red remote sensing and control.

While preferred embodiments of the invention have been shown and described, it will be apparent to those skilled in this art that various modifications, such as different geometries of the new drain region 16, or some overlap of region 16 with region 18, or using a silicon-on-insulator (SOI) substrate or complementary conductivity type semiconductors such as a p-channel MOSFET or different device geometries such as circular or non-planar geometries, may be made in this embodiments without departing from the spirit of the present invention and are within the scope of this invention.

What is claimed is:

1. A light emitting field effect transistor (FET) comprising:
    only one source, only one gate and only one drain;
    a semiconductor substrate of first semiconductivity type of indirect bandgap semiconductor;
    said source of second semiconductivity type formed in said substrate;
    said drain of said second semiconductrivity type formed in said substrate and separated from said source by a channel;
    said gate overlaying said channel to control the flow of current between said drain and said source;
    said drain having a light emitting extension encroaching toward said channel and doped with impurity which forms a light emitting center in said indirect bandgap semiconductor to activate a light emitting process when a drain voltage is applied with a high enough electric field to generate highly energetic electrons for cathodoluminescence.

2. The light emitting field effect transistor as described in claim 1, wherein said impurity is a rare-earth group element.

3. The light emitting field effect transistor as described in claim 2, wherein said impurity is erbium.

4. The light emitting field effect transistor as described in claim 2, wherein said impurity is erbium and oxygen.

5. The light emitting field effect transistor as described in claim 1, wherein said extension does not overlap with said gate.

6. The light emitting field effect transistor as described in claim 1, wherein said substrate is of silicon semiconductor.

7. The light emitting field effect transistor as described in claim 1, wherein said light emitting process is in the infrared wavelength range.

8. The light emitting field effect transistor as described in claim 1, wherein said FET is an MOSFET.

9. The light emitting field effect transistor as described in claim 1, wherein said FET is a metal-semiconductor field effect transistor.

* * * * *